US006970064B2

(12) United States Patent
Zhang et al.

(10) Patent No.: US 6,970,064 B2
(45) Date of Patent: Nov. 29, 2005

(54) CENTER-TAP TRANSFORMERS IN INTEGRATED CIRCUITS

(76) Inventors: Minghao (Mary) Zhang, 20975 Valley Green Dr., Suite 293, Cupertino, CA (US) 95014; John C. Tung, 20975 Valley Green Dr., Suite 293, Cupertino, CA (US) 95014

( * ) Notice: Subject to any disclaimer, the term of this patent is extended or adjusted under 35 U.S.C. 154(b) by 121 days.

(21) Appl. No.: 10/624,308

(22) Filed: Jul. 22, 2003

(65) Prior Publication Data
US 2004/0195651 A1    Oct. 7, 2004

Related U.S. Application Data

(63) Continuation-in-part of application No. 10/325,038, filed on Dec. 20, 2002, now Pat. No. 6,683,480, which is a continuation-in-part of application No. 10/137,988, filed on May 2, 2002, now Pat. No. 6,559,693, which is a continuation-in-part of application No. 09/947,643, filed on Sep. 5, 2001, now Pat. No. 6,433,595.

(51) Int. Cl.$^7$ .............................................. H01F 5/00
(52) U.S. Cl. ................................................... 336/200
(58) Field of Search ................. 336/223, 232, 336/200, 150, 192; 29/602.1, 846; 257/531

(56) References Cited

U.S. PATENT DOCUMENTS

| | | | |
|---|---|---|---|
| 5,497,137 A * | 3/1996 | Fujiki ......................... 336/200 |
| 5,572,179 A | 11/1996 | Ito ............................. 336/200 |
| 5,892,425 A | 4/1999 | Huhn et al. .................. 336/200 |
| 5,969,590 A * | 10/1999 | Gutierrez .................... 336/200 |
| 6,188,306 B1 | 2/2001 | Wollesen .................... 336/200 |
| 6,380,835 B1 | 4/2002 | Lee ............................. 336/200 |
| 6,779,261 B2 * | 8/2004 | Yue ............................. 29/846 |
| 6,801,114 B2 * | 10/2004 | Yang et al. ................. 336/200 |
| 6,831,544 B2 * | 12/2004 | Patel et al. ................. 336/200 |
| 2002/0105406 A1 | 8/2002 | Liu ............................. 336/200 |
| 2003/0030497 A1 | 2/2003 | Duncan ....................... 331/34 |

OTHER PUBLICATIONS

John Long "Monolithic Transformers for Silicon RF IC Design", IEEE Journal of solid-state circuits, vol. 35, No. 9, Sep. 2000.

Alireza Zolfaghari et al "Stacked inductors and transformers in CMOS technology", IEEE Journal of solid-state circuits, vol. 36, No. 4, Apr. 2001.

S. Mohan "Modeling and Characterization of on-chip transformers", the publication date and source are unknown, the publication is believed to be earlier than the filing date of this application, no date.

* cited by examiner

Primary Examiner—Tuyen T Nguyen
(74) Attorney, Agent, or Firm—Joe Zheng

(57) ABSTRACT

Techniques for implementing transformers with center-taps are described. Based on an overlay winding structure, according to one embodiment, the primary and the secondary of the transformer are respectively formed on two separate layers that are stacked on top of each other, wherein the secondary includes two segments, the two respective terminals of the two segments are coupled together to a component in a circuit to form a center-tap of the secondary. According to another embodiment, three or more separating windings are formed on separate layers. At least one of the windings is a conducting stripe wound in loops and includes a center-tap that extends across but not electrically connected to the loops of the conducting stripe by detouring the conducting stripe through other layers.

25 Claims, 20 Drawing Sheets

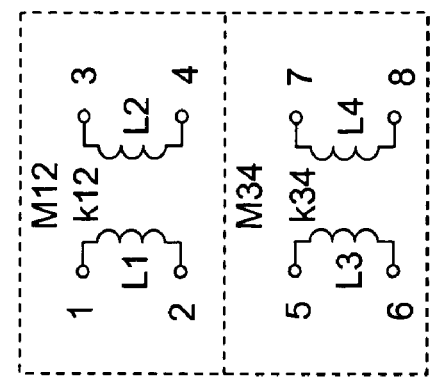
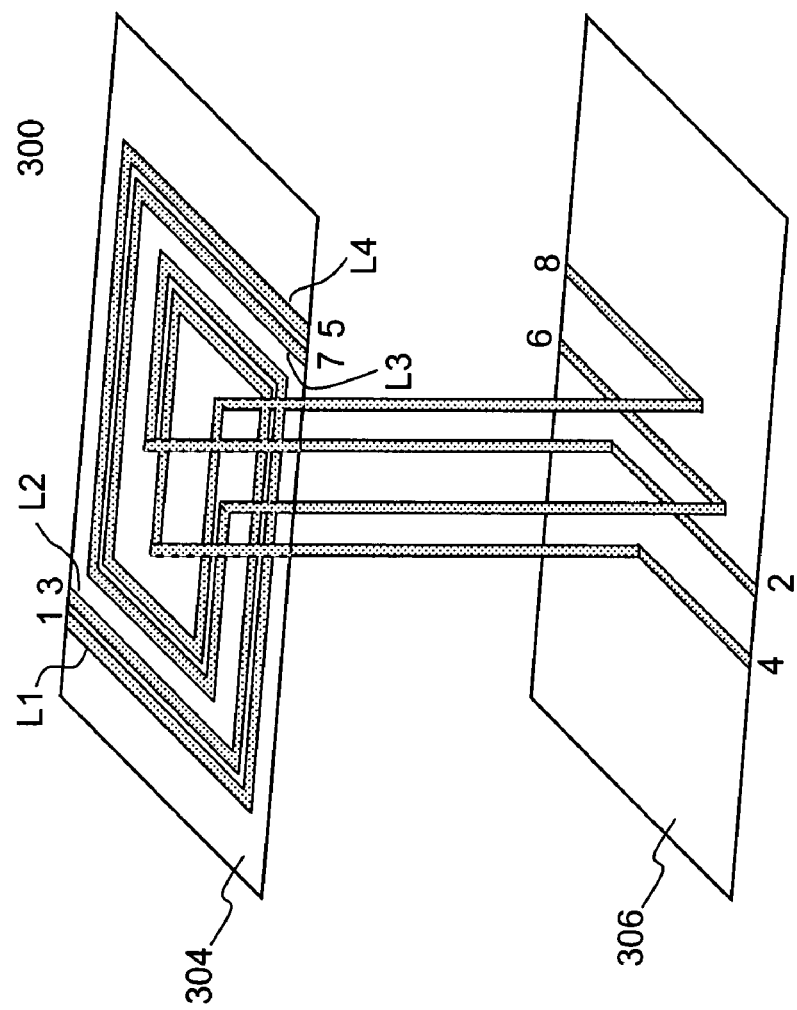
FIG. 3B
FIG. 3A

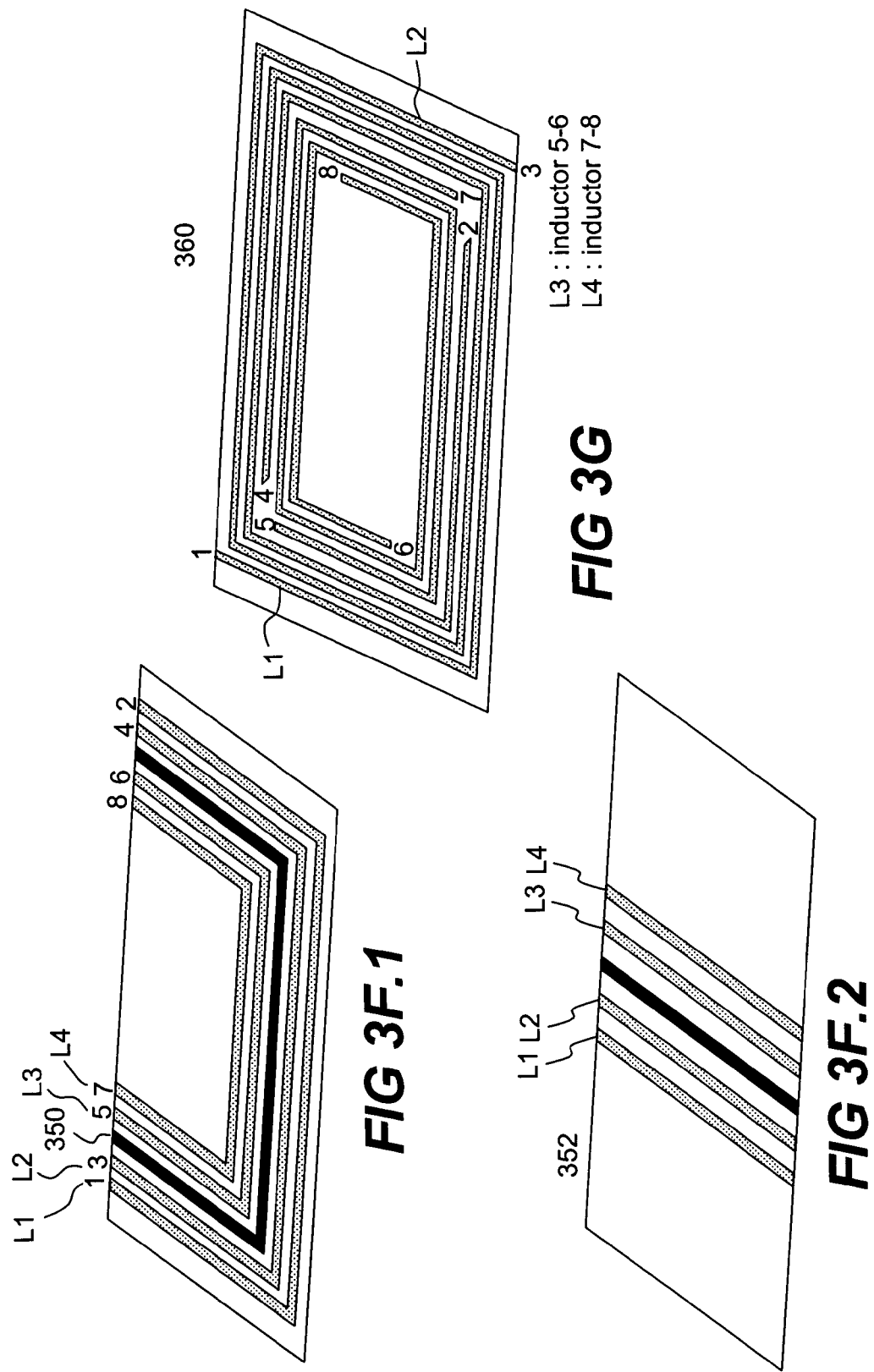

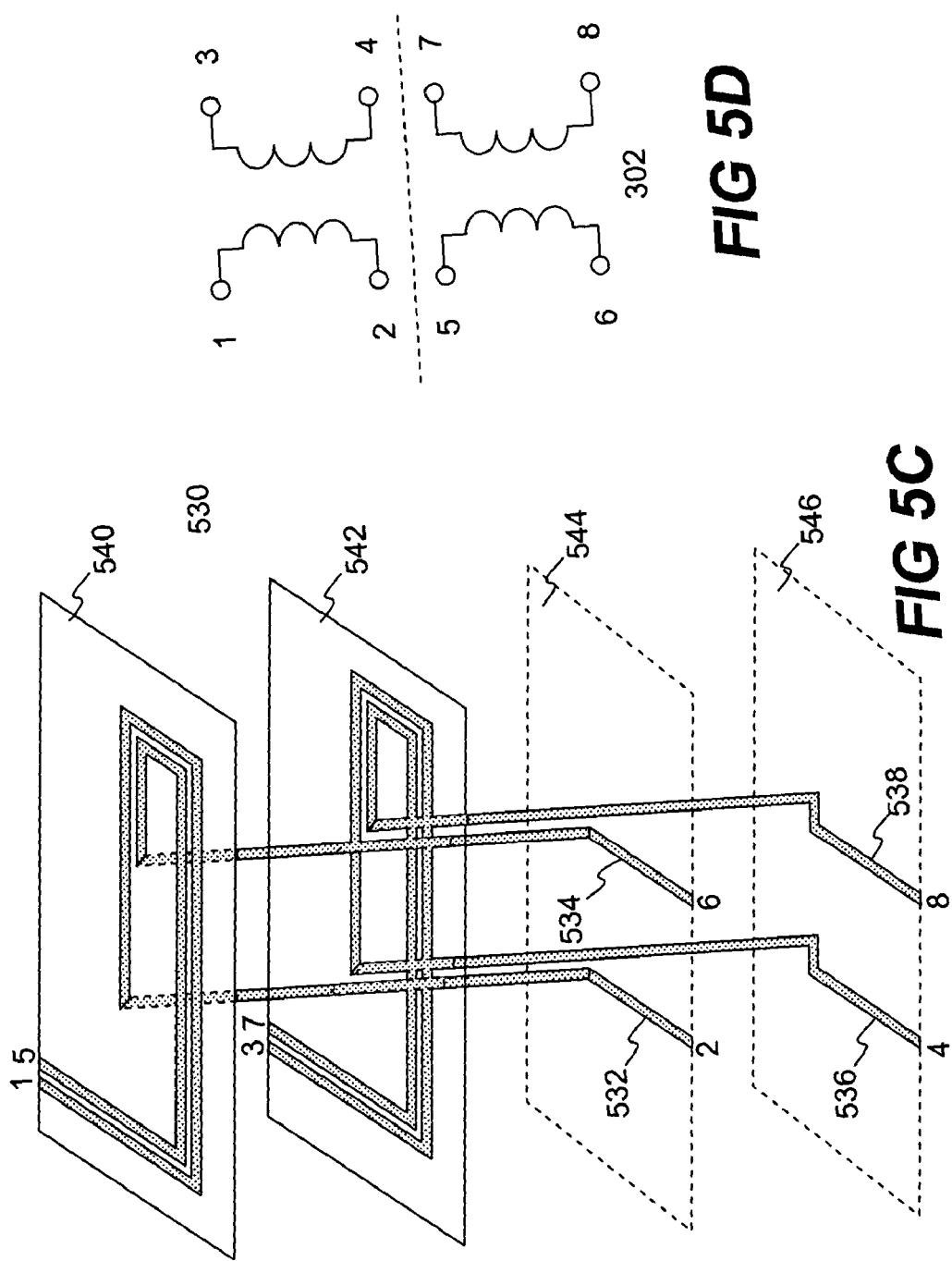

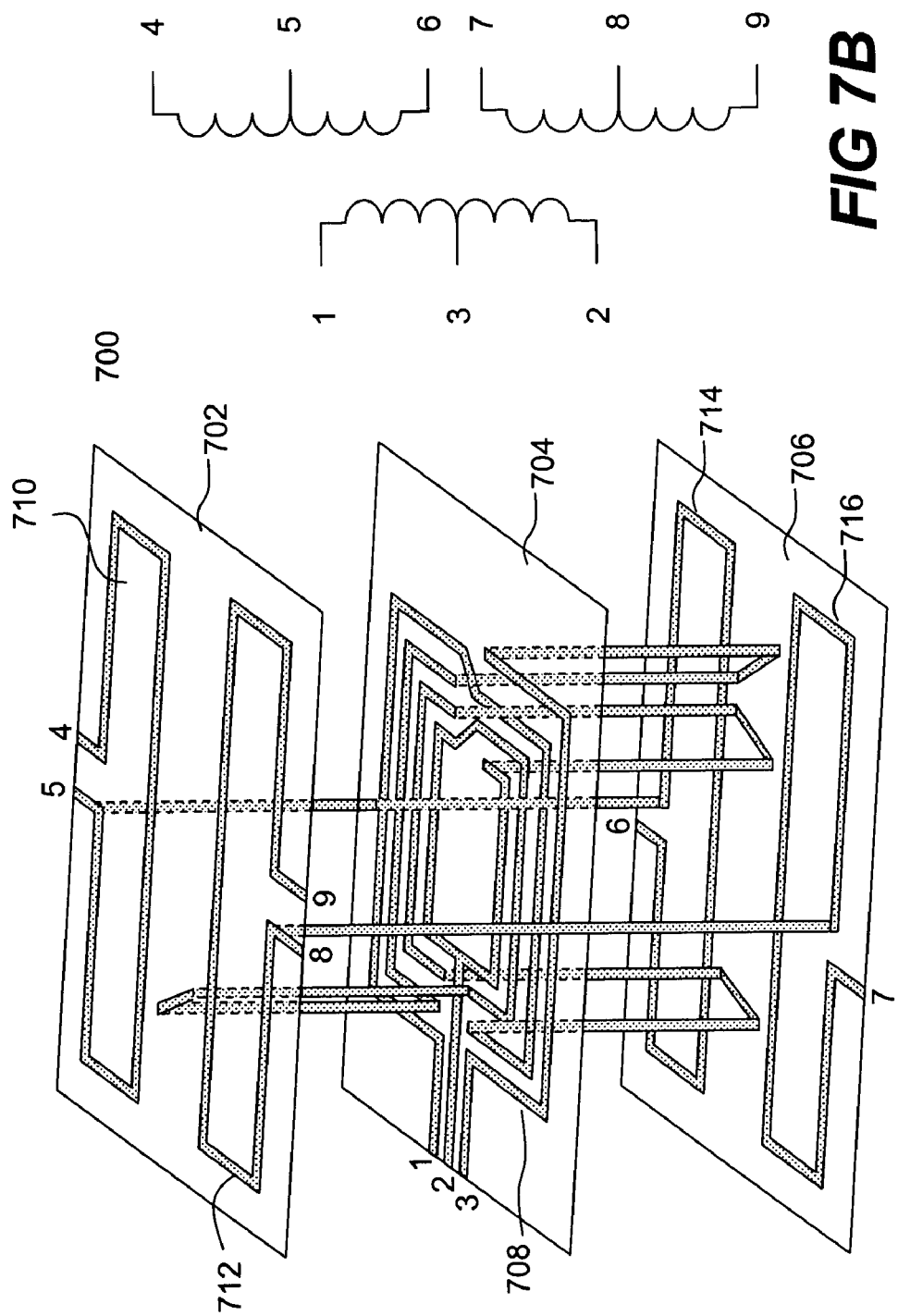

CENTER-TAP TRANSFORMERS IN INTEGRATED CIRCUITS

CROSS REFERENCE TO RELATED APPLICATIONS

This application is a continuation-in-part application of U.S. application Ser. No.: 10/325,038, filed Dec. 20, 2002, now U.S. Pat. No. 6,683,480 which is a continuation-in-part of U.S. patent application Ser. No.: 10/137,988, filed May 2, 2002, now U.S. Pat. No.: 6,559,693, which claims the priority of U.S. patent application Ser. No. 09/947,643, filed Sep. 5, 2001, now U.S. Pat. No. 6,433,595, all of which are incorporated herein for all purposes.

BACKGROUND OF THE INVENTION

1. Field of the Invention

The invention is generally related to the area of integrated circuits designs. More particularly, the invention is related to designs of multiple inductors or transformers in integrated circuits, wherein the transformers have strong magnetic couplings but do not occupy multiple areas. The invention is also related to transformers with one or more center-taps.

2. The Background of Related Art

An inductor is a passive electronic component that stores energy in the form of a magnetic field. In its simplest form, an inductor consists of a wire loop or coil. The inductance is directly proportional to the number of turns in the coil. Inductance also depends on the radius of the coil, the space between the turns, thickness of the material of the coil, and on the type of material around which the coil is wound. For a given coil radius and number of turns, dielectric materials such as wood, glass, and plastic result in the least inductance while ferromagnetic substances such as iron, laminated iron, and powdered iron increase the inductance. The shape of the core as well as the wire or coil can also be significant. The standard unit of inductance is the henry, abbreviated H. This is a large unit. More common units are the microhenry, abbreviated $\mu H$ (1 $\mu H = 10^{-6}$ H) and the millihenry, abbreviated mH (1 mH=$10^{-3}$ H). Occasionally, the nanohenry (nH) is used (1 nH=$10^{-9}$ H). As signal frequency goes high, for example, in gigahertz range, inductors with the picohenry (pH) are often used (1 pH=$10^{-12}$ H).

Inductors are used with capacitors in various applications such as wireless communications. An inductor connected in series or parallel with a capacitor can provide discrimination against unwanted signals. When two or more inductors are arranged close to each other, transformers are created. In addition to the inductances, performance of the transformers is also controlled by coupling factors that are in turn determined by the proximity of the inductors. In a simple form, a transformer has two inductors, usually with an iron core, that have two lengths of wires wrapped around it. The two coils of wire do not electrically connect, and are normally attached to different circuits. Inductors and transformers have been widely used and can be found almost in every electronic circuit or system.

However, it is well known that it is difficult to fabricate inductors or transformers onto integrated circuit (IC) chips. To have usable inductors (or transformers) in IC chips, the wafer areas occupied by the inductors can be significant, resulting in very expensive IC chips. In some cases, resistors are substituted for inductors. In other cases, inductance is simulated by simple electronic circuits using transistors, resistors, and capacitors fabricated onto IC chips. As the frequency of signals goes higher, the performance of such inductor "substitutions" are no longer satisfactory. True inductors or transformers are demanded.

FIGS. 1A–1D show respectively four transformers that are commonly used in silicon, each of the transformers including two inductors wound according to one type of winding configuration. It can be understood that, when several such transformers are used in an IC chip, multiple spaces for the transformers must be allocated, resulting in a very expensive IC chip, because the cost of an IC chip is largely determined by the physical area of the IC chip in a piece of semiconductor wafer. Essentially, the larger a physical area of an IC chip is, the higher cost the IC chip will be.

There is thus a tremendous need for solutions of providing on-chip transformers without taking up too much wafer space and, at the same time, having strong couplings to provide high secondary inductance values.

SUMMARY OF THE INVENTION

This section as well as the abstract of the present invention is for the purpose of summarizing some aspects of the present invention and to briefly introduce one or more preferred embodiments. Simplifications or omissions may be made to avoid obscuring the purpose of the section and the abstract. Such simplifications or omissions are not intended or should not be interpreted to limit the scope of the present invention.

The present invention can be implemented as apparatus and method therefor. According to one aspect of the present invention, multiple transformers are integrated according to one of the winding configurations without occupying multiple individual silicon spaces that would otherwise be occupied by the multiple transformers. Further, it is well understood that the multiple individual silicon spaces for the transformers can result in the parasitic effects. The implementation of multiple transformers in a confined single silicon space will advantageously reduce the parasitic effects. As a result, an integrated circuit chip employing transformers implemented in accordance with the present invention can accommodate much higher signal frequency, and have smaller size, thus the cost of the integrated circuit chip can be substantially reduced.

According to another aspect of the present invention, a grounding stripe is provided or deposited between inductors or a grounding shield is provided across layers to shield or prevent from undesired couplings from the inductors or inductors on the different layers that are not supposed to be coupled to form transformers. These unwanted transformers may introduce undesirable artifacts or distortions to signals and even destabilize circuits. With the proper grounding shielding, integrated transformers do not interfere with each other and perform as they were individually implemented.

Depending on implementation of the present invention, there are several winding configurations and combinations thereof, each providing a solution of integrating several transformers in a small silicon area and believed independently novel in the art. Broadly speaking, there are types of multi-interwound (MI), multi-overlay (MO) and multi-interwound-overlay (MIO), each or combination thereof can be extended to, for example, single-layer multi-interwound (SLMI), multi-layer single-interwound (MLSI), multi-layer multi-interwound (MLMI), multi-layer multi-overlay (MLMO), and multi-layer multi-interwound-overlay (ML-MIO), terms used herein to closely describe the corresponding winding configurations. In addition, special winding configurations are provided to accommodate transformers with one or more primary windings and/or one or more secondary windings. In these winding configurations, center-taps are provided to divide inductors so as to realize more than one winding or symmetric secondaries.

Depending on the winding configurations, current flows in respective inductors can be in same or opposite directions, resulting in symmetric or asymmetric winding configurations. The symmetric or asymmetric winding configurations can be advantageously used in various circuits or systems resulting in better performance and lower costs.

There are many benefits, advantages and features in the present invention. One of them is to integrate several transformers without occupying several spaces that would otherwise be occupied by the transformers. Another one of them is a mechanism to isolate the integrated transformers by depositing grounding stripes between every pair of inductors or grounding shields across layers so that undesirable cross-coupling can be removed or minimized.

Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will become better understood with regard to the following description, appended claims, and accompanying drawings where:

FIG. 3A shows an exemplary winding configuration, referred to as single layer multi-interwound (SLMI);

FIG. 3B shows an equivalent schematic symbol or circuit of two transformers implemented in accordance with one embodiment of the present invention;

FIG. 3F.1 and FIG. 3F.2 each show a special winding configuration in which two transformers are integrated in a confined silicon space on a single layer with a grounding separator;

FIG. 3G shows a set of transformers integrated using single-layer multi-interwound configuration;

FIG. 5C shows a winding configuration, referred to as a multi-overlay, which may also be viewed that the winding configuration is based on the features, benefits, and advantages of one or more of the above configurations;

FIG. 5D shows an equivalent schematic symbol or circuit of two transformers implemented in accordance with FIG. 5C;

FIG. 7A shows what is called tri-transformer including one primary winding with a center-tap and two separate overlaid secondary windings, each with a center-tap;

FIG. 7B shows the equivalent schematic symbol or circuit of the transformer of FIG. 7A.

DETAILED DESCRIPTION OF THE PREFERRED EMBODIMENT

Figure 1C:
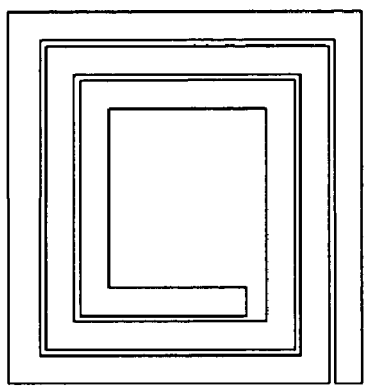
FIG. 1A–FIG. 1D (Prior art) each show a type of winding configuration and represent a single transformer.
Figure 1D:
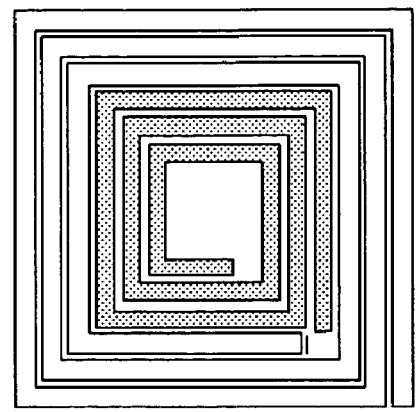
Figure 1A:
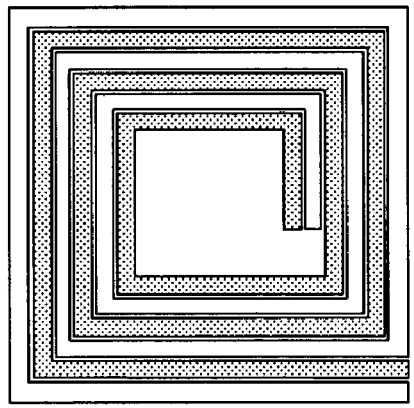
Figure 1B:
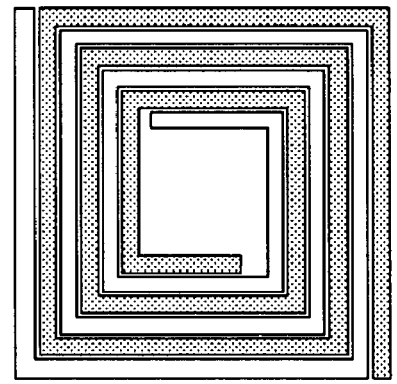

The present invention pertains to integrating multiple transformers in silicon without occupying multiple individual silicon spaces that would otherwise be occupied by the multiple transformers. It is well understood that the multiple individual silicon spaces for the transformers can introduce undesirable parasitic effects (e.g. from extended connections around a circuit). The implementation of multiple transformers in a confined single silicon space will advantageously reduce the parasitic effects. As a result, an integrated circuit chip employing these transformers implemented in accordance with the present invention will be of small size and thus the cost of the integrated circuit chip can be substantially reduced. To remove or minimize undesired cross-couplings between inductors in a layer or inductors on layers that are not supposed to be coupled, a grounding stripe is formed, deposited, provided or deposited between the inductors or a grounding shield (wall) is provided across the layers. As a result, the integrated transformers do not interfere with each other and perform as they were individually implemented.

The detailed description of the present invention is presented largely in terms of procedures, steps, logic blocks, processing, or other symbolic representations that directly or indirectly resemble the operations of electronic circuits or systems that process signals for desired outputs. These process descriptions and representations are typically used by those skilled in the art to most effectively convey the substance of their work to others skilled in the art. Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments.

Embodiments of the invention are discussed herein with reference to FIGS. 1A–8F in which like numerals refer to like parts throughout the several views. However, those skilled in the art will readily appreciate that the detailed description given herein with respect to these figures is for explanatory purposes as the invention extends beyond these limited embodiments Transformers can be found in many circuits. When integrated in silicon, transformers can provide useful performance characteristics, especially in processing high speed signals, thus one or more transformers will be used. FIG. 1A–FIG. 1D each show a type of winding configuration and represent a single transformer. When one of more such transformers are employed, each of the transformers will take an individual space on silicon. As the number of the transformers increases, the number of the individual space for the transformers is increased. Not only will the cost of a resulting integrated circuit be of considerably expensive, but also undesirable parasitic effects are introduced by connections to the transformers that are scattered around in a silicon layout, causing considerable instability of the circuit and significant limiting the capability of processing signals at high frequency.

Figure 2:
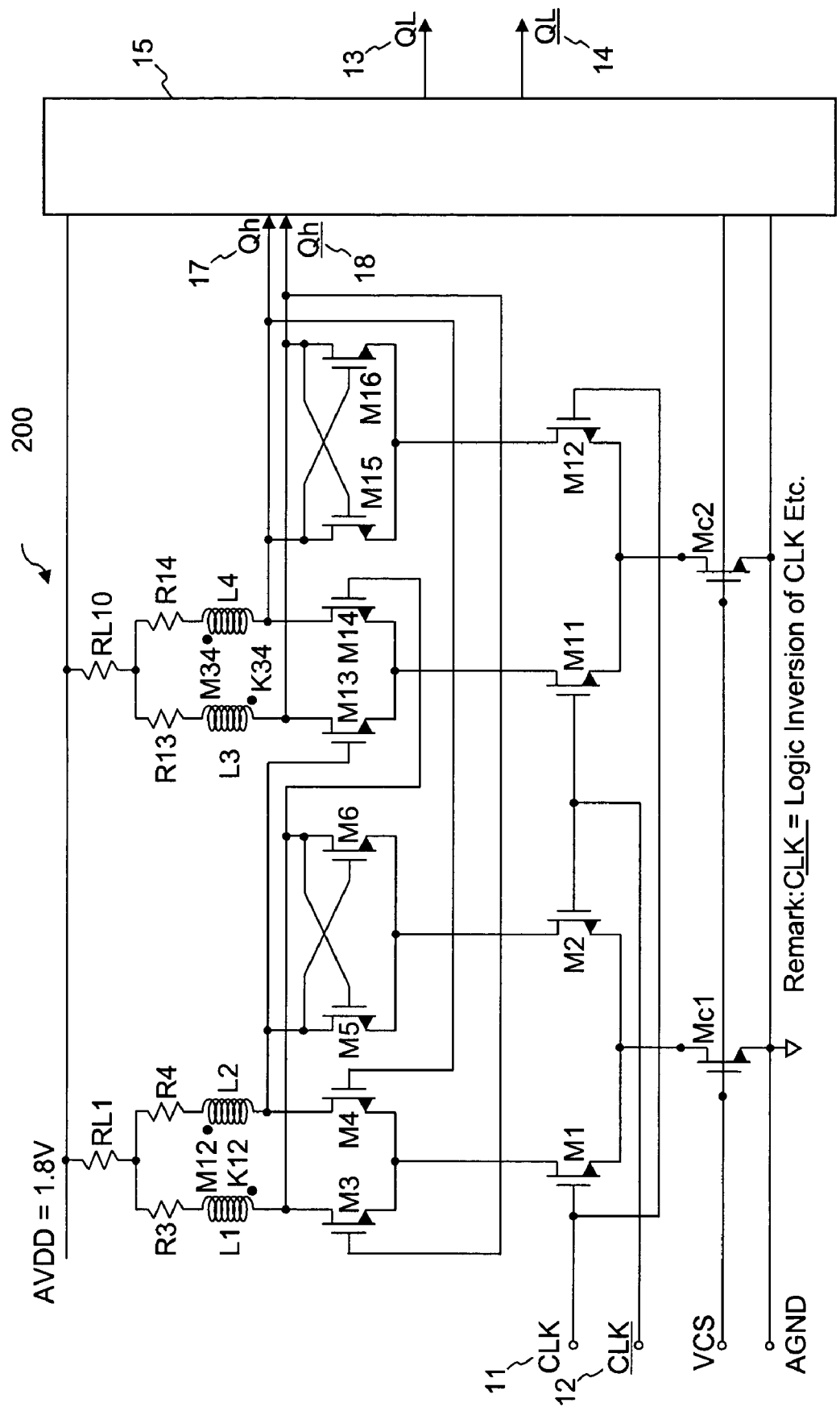
FIG. 2 shows an exemplary circuit that uses a first transformer M12 including two inductors L1 and L2 and a second transformer M34 including inductors L3 and L4.

FIG. 2 shows an exemplary circuit 200 that uses a first transformer M12 including two inductors L1 and L2 and a second transformer M34 including inductors L3 and L4. In the prior art systems, the transformers are individually implemented, such as one of those in FIG. 1, resulting in an occupancy of multiple spaces of silicon area, each space for one transformer. It is well known in the art that the circuit itself (excluding the transformers) is of very small in size in a silicon layout. Accordingly, the transformers, being relatively big in size, are often placed outside of or surrounding the circuit, resulting in extended terminals of the transformers to the circuit and thus causing unnecessary parasitic effects that can significant impacts on the overall performance of the circuit. One of the key features in the present invention is to provide techniques to integrate two or more transformers in one silicon space without taking up multiple spaces. Thus not only is the overall silicon size for the circuit small, but the parasitic effects can be minimized.

In general, at silicon level, an inductor is created by a microstripe line and therefore sometimes referred to as monolithic implementation of a transmission line conductor. Given a predetermined area, a stripe is normally wound in a way to occupy a silicon area as small as possible. When two such inductors are arranged close enough to each other, as a result of magnetically coupling between the two inductors, a basic transformer (including a primary winding and a second winding) is created. Coupling is the extent to which the magnetic field of each coil overlaps the other coil. Coupling can range from 0% (no interaction at all) to 100% (full interaction). In essence, the physical characteristics of a basic transformer in silicon is controlled by at least these parameters: lengths and widths of the stripes, winding configuration of the two inductors (one as a primary and the other as a secondary), and spacing between the two inductors or possibly a type of material deposited between the two inductors. The corresponding electric physical characteristics of the transformer are thus a function of respective inductances of the inductors, and a coupling factor between the inductors.

Depending on the performance characteristics being sought from one or more transformers at silicon level, there can be a number of winding configurations. To facilitate the description of the present invention, it deems appropriate to describe respectively some of the key winding configurations. These winding configurations are related to each other and each is believed independently novel in the art.

Referring now to FIG. 3A, there shows an exemplary winding configuration 300, referred to as a single-layer multi-interwound (SLMI) type. As the name suggests, transformers are formed by stripes interwound on a single layer. For simplicity, two transformers M12 and M34 are shown in FIG. 3A. The first transformer M12 is formed by two inductors L1 and L2 and the second transformer M34 is formed by two inductors L3 and L4. The equivalent schematic symbol or circuit of these two transformers is shown as a circuit 302 in FIG. 3B. As shown in FIG. 3A, both transformers M12 and M34 are formed on a single layer 304 (the layer 306 is for laying out the terminals). Each of the transformers M12 and M34 has a coupling factor K12 or K34, determined respectively, how the inductors L1 and L2 or L3 and L4 are coupled. As an example, the two transformers M12 and M34 can be used in FIG. 2.

According to one embodiment of the present invention, a number of conducting or semi-conducting stripes are wound in opposite into a flat spiral, namely circling around a central point in a flat curve or coiled on a substrate (e.g., CMOS). Depending on the design needs and available silicon space, the coiling shape may be of round or square on the substrate. FIG. 3A shows that a set of two stripes for inductors L1 and L2 are wound anti-clockwise into a flat spiral while a set of another two stripes for inductors L3 and L4 are wound clockwise and interlaced with that for inductors L1 and L2 into the flat spiral. In other words, the two sets of stripes are wound in opposite direction and between the spaces formed by the other set.

Figure 3D:
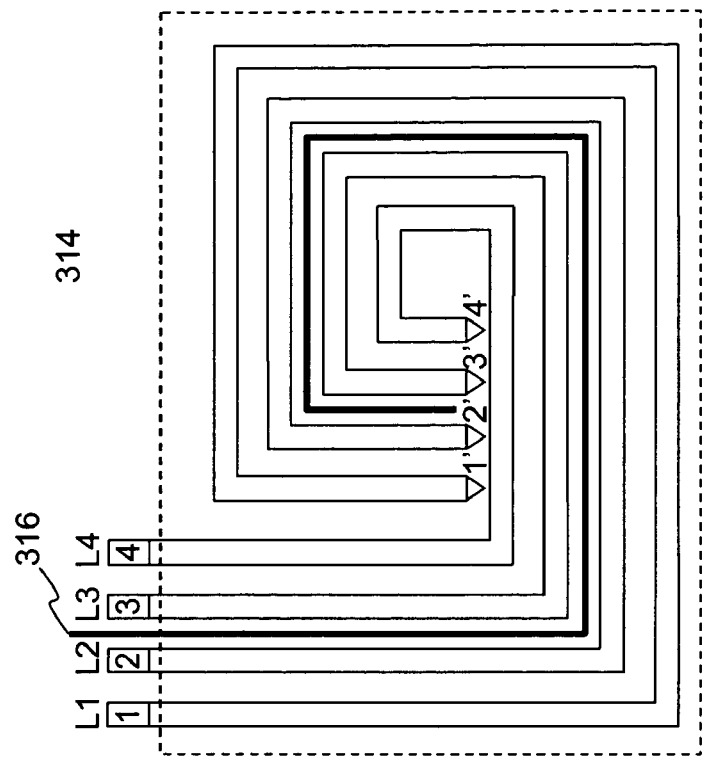
FIG. 3D shows an improved design of the two transformers of FIG. 3C, in which a grounding is used to separate the two transformers so as to avoid cross-couplings between the transformers or among the inductors.
Figure 3C:
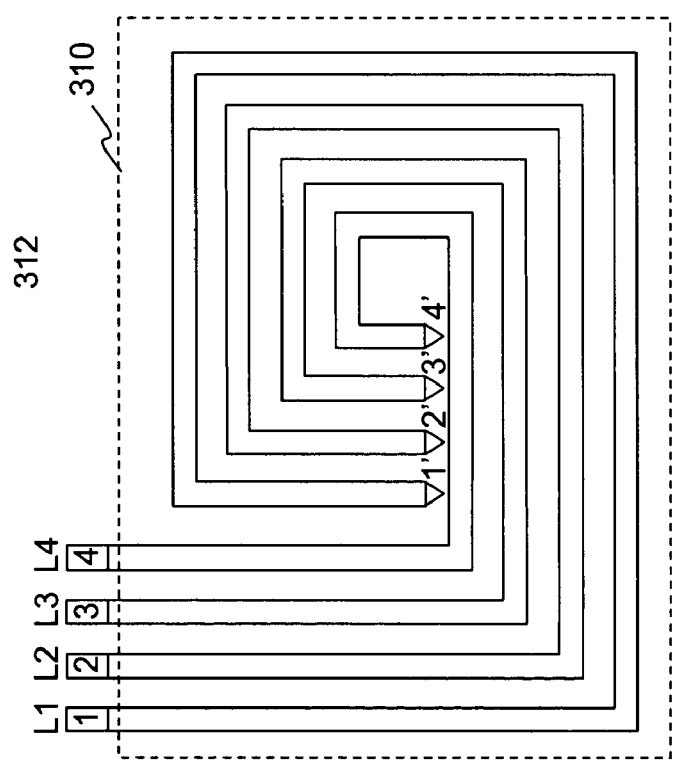
FIG. 3C shows two transforms integrated by winding stripes in parallel into a flat spiral within a predetermined silicon area.

FIG. 3C shows a special case of the single-layer with multiple transformers in which stripes are wound in parallel into a flat spiral within a predetermined silicon area. As shown in FIG. 3C, four conducting stripes 312 are used to form two transformers M12 and M34. The equivalent schematic symbol or circuit of the two transformers M12 and M34 is similar to that shown in FIG. 3B. According to one embodiment of the present invention, a number of conducting or semi-conducting stripes are wound in parallel into a flat spiral, namely circling around a central point in a flat curve or coiled on a substrate (e.g., CMOS). The winding configuration as shown in FIG. 3C allows more transformers to be integrated in such fashion that the silicon space that would be otherwise occupied by individual transformers is substantially reduced.

However, it is noticed that as more transformers are integrated in accordance with FIG. 3A or 3C, side facts, essentially unwanted transformers, are created among the inductors. The unwanted transformers could be formed by complicated couplings among the inductors L1, L2, L3 and L4. In a simplest term, each of the unwanted basic transformers is the result of the coupling between L1 and L3, L1 and L4, L2 and L3, or L2 and L4. More complicated transformers could be the result of cross-couplings among all the inductors. Unless characteristics from these couplings are intentionally used or well controlled, these unwanted transformers may potentially cause a circuit to malfunction or be unstable.

Figure 3E:
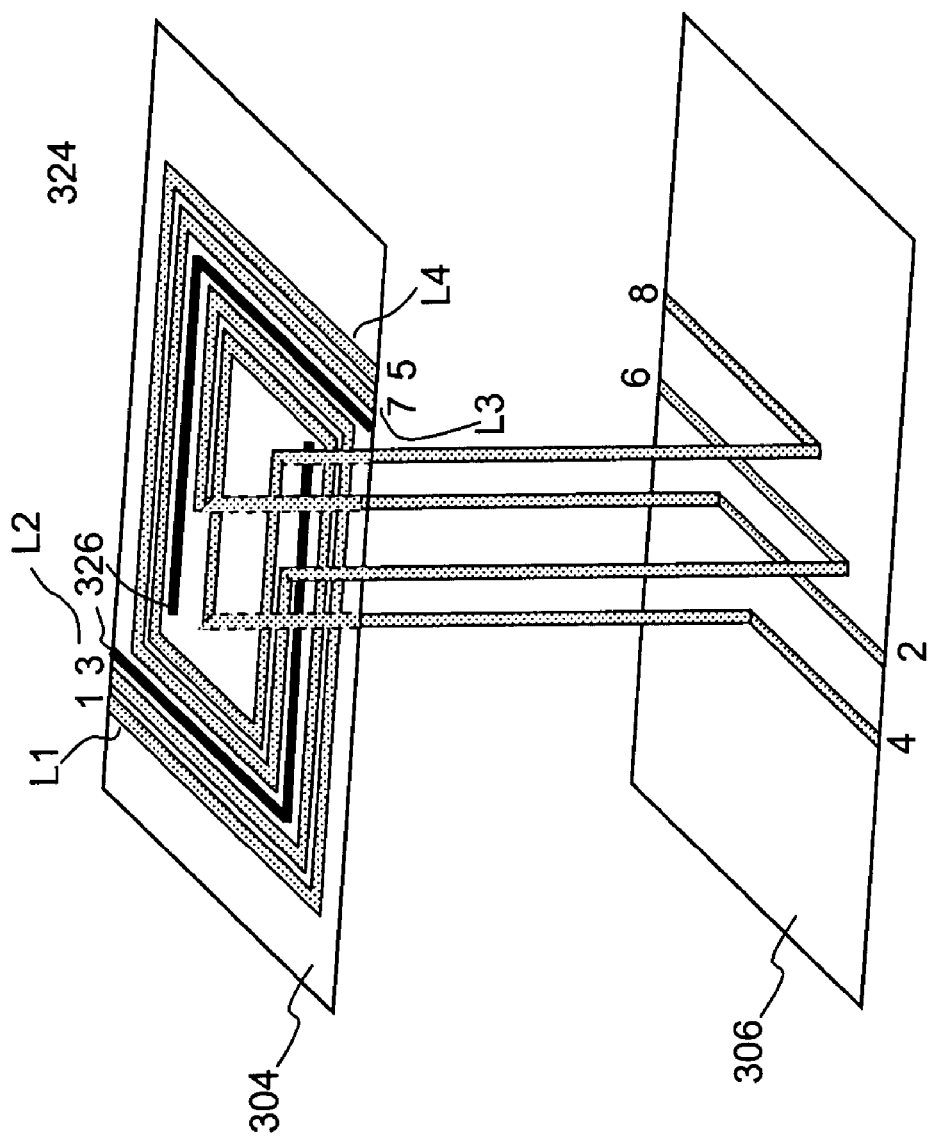
FIG. 3E shows a corresponding design of the winding configuration of FIG. 3A, in which a grounding is used to separate the two transformers so as to avoid cross-couplings between the transformers or among the inductors.

To overcome the side effects, FIG. 3D shows an improved design 314 over the design 312 of FIG. 3C according to one embodiment of the present invention. Essentially, a grounding stripe 316 is formed, placed or deposited between the inductors L2 and L3 such that the coupling between L1 and L3, L1 and L4, L2 and L3, or L2 and L4 are isolated, resulting in two independent transformers M12 and M34. Accordingly, the design 300 of FIG. 3A can be improved and the improved design 324 thereof according to one embodiment of the present invention is shown in FIG. 3E. A grounding stripe 326 is deposited between the conductors L2 and L3, L2 and L4 or L1 and L3. By virtue of the present invention, a number of conducting or semi-conducting stripes are wound into a flat spiral on a type of substrate and one or more grounding stripe are respectively formed, placed or deposited between every set inductors (two or more) that form a transformer, creating a grounding shield between two transformers or among multiple transformers.

As the number of transformers integrated in accordance with FIG. 3A or FIG. 3C (or FIG. 3D or 3E) increases, the inductance of the individual inductors becomes limited. It can be appreciated from the configurations that the physical limitation of the spiral does not allow further winding with too many stripes in parallel. According to one embodiment, additional layers are employed. In other words, the individual stripes are extended to these additional layers so as to increase the inductance of each of the inductor and the coupling factor. The use of multiple layers for such purposes leads to another type of winding configuration referred to herein as multiple-layer interwound, the detail of which will be further provided below with other winding configurations.

FIGS. 3F.1 and 3F.2 show, respectively, that a special winding configuration 350 or 352 in which two transformers are integrated on a confined silicon space using simple transmission lines. The equivalent schematic symbol or circuit of these two transformers is similar to that shown as a circuit 302 in FIG. 3B. Similar to FIG. 3D, a ground stripe is placed between two inductors L2 and L3 such that no coupling can be occurred between L1 and L3, L1 and L4, L2 and L3 as well as L2 and L4. The winding configuration 350 or 352 can be useful when transformers with small inductance are needed (e.g., for circuitry operating in very high frequencies).

FIG. 3G shows a set of transformers 360 using single-layer multi-interwound configuration. As the names suggests, multiple transformers are integrated on a single layer and each of the transformers is formed by inductors whose stripes are interwound. As shown in FIG. 3G, a first transformer is formed by two inductors L1 and L2, the stripes thereof are interwound on the outskirt of a predetermined silicon area, a second transformer is formed by two inductors L3 and L4, the stripes thereof are interwound inside of the first transformer. If desired to isolate the two transformers, a grounding stripe may be placed between the two transformers. Namely the grounding stripe is placed to surround the second transformer such that no cross-coupling between the transformers or among the inductors.

Figure 4A:
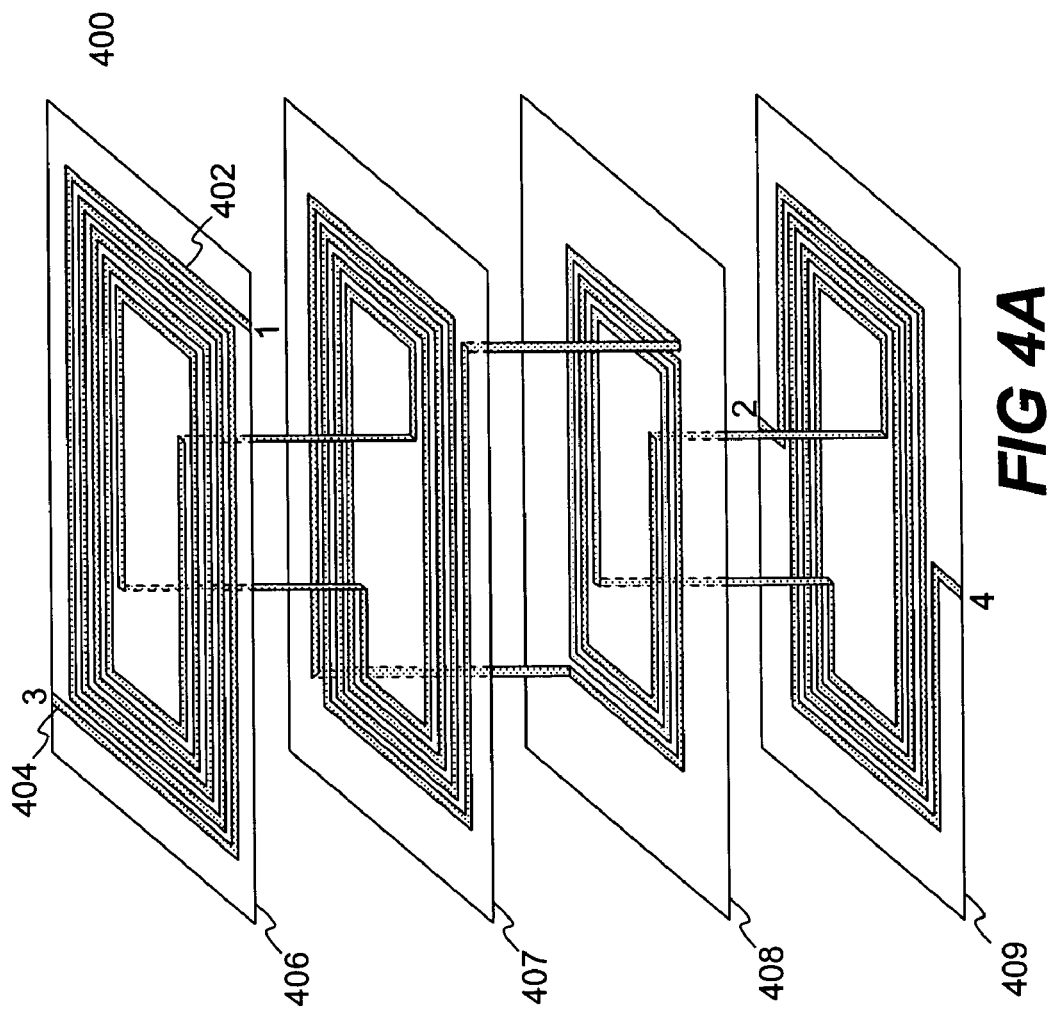
FIG. 4A shows an exemplary winding configuration, referred to as a multi-layer single-interwound (MLSI) type.
Figure 4B:
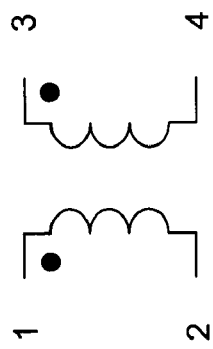
FIG. 4B shows an equivalent schematic symbol or circuit of one transformer implemented in accordance with one embodiment of the present invention (e.g., FIG. 4A)

Referring now to FIG. 4A, there is an exemplary winding configuration 400, referred to as multi-layer interwound. As the name suggests, one or more layers are employed to extend the stripes of the individual inductors. FIG. 4A shows that a single transformer 400 is formed by two inductors 402 and 404. The two inductors 402 and 404 are formed by extending respective stripes continuously from a first layer 406 to a second layer 407, from the second layer 407 to a third layer 408, and from the third layer 408 to a fourth layer 409. As a result, the inductance of each of the two inductors 402 and 404 is significantly increased to meet a predetermined design requirement (e.g., L=100 nH). The equivalent schematic symbol or circuit of the transformer 400 is shown in FIG. 4B. Given the description herein, those skilled in the art can readily appreciate that the approach of using multiple layers may be extended to other winding configurations.

Figure 4C:
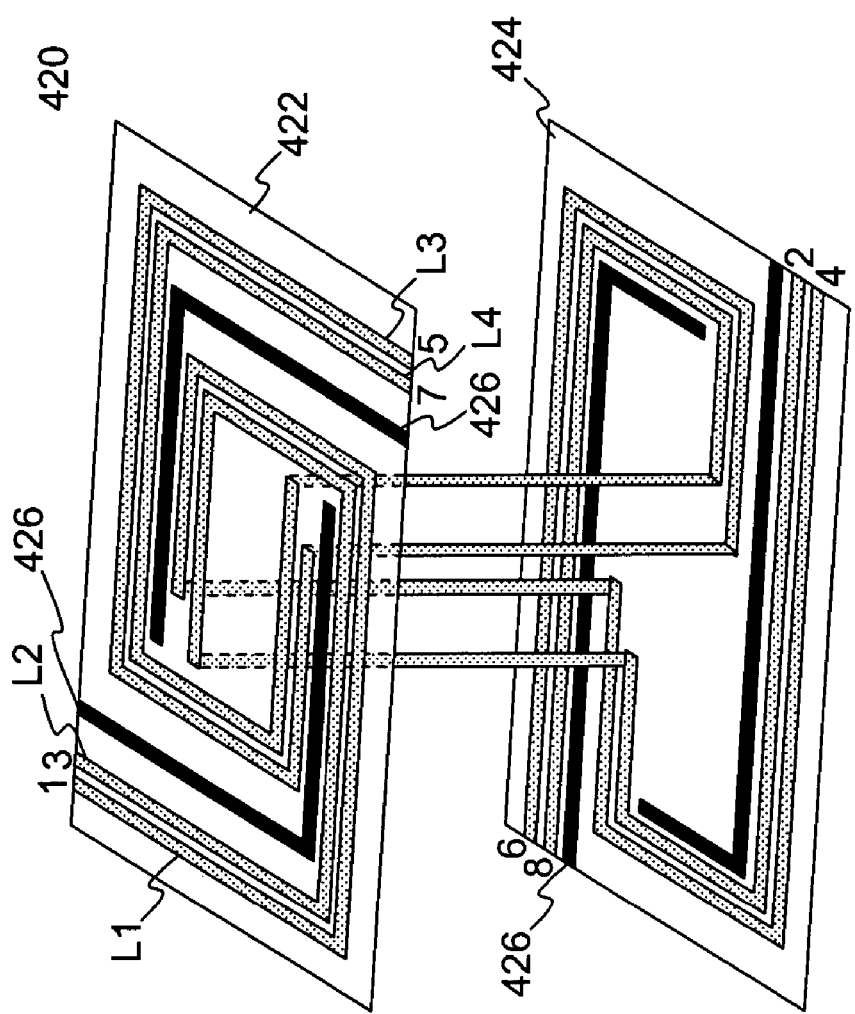
FIG. 4C illustrates an exemplary transformer of the multi-layer multi-interwound type according to one embodiment of the present invention and uses grounding stripes to shield, prevent from or separate undesired couplings between inductors that are not supposed to be coupled.

Each of the configurations FIG. 3A, FIG. 3C, FIG. 3D, FIG. 3E, FIG. 3F.1, FIG. 3F.2, FIG. 3G and FIG. 4A has its own unique features, benefits and advantages in creating integrated transformers in silicon. Given the description herein, a combination of some of the winding configurations can provide another winding configuration, referred to as a multi-layer multi-interwound type, which includes one or more layers. For example, multiple transformers are formed by interwinding the stripes that extend respectively to these one or more layers. FIG. 4C illustrates exemplary integrated transformers 420 of the multi-layer multi-interwound type. Two transformers 420 include two layers 422 and 424, each itself is a single-layer multi-interwound type. The inductors on each of the two layers 422 and 424 are connected to extend the inductance thereof. Thus, there are two transformers are formed, one with the inductors L1 and L2, the other with the inductors L3 and L4. The equivalent schematic symbol or circuit of the integrated transformers 420 is similar to that shown in FIG. 3B.

To avoid the unwanted couplings between the inductors L1 and L3, L1 and L4, L2 and L3, and L2 and L4 or cross-coupling among the inductors, one or more grounding stripes 426 can be placed, formed or deposited between two inductors that are not supposed to be coupled. In particular, when the inductors L1, L2, L3 and L4 are wound into a spiral on a layer (e.g., 422 or 420), a grounding stripe is always deposited between two inductors that are not supposed to be coupled. For example, a grounding metal stripe 426 is placed between two inductors L2 and L3 and also placed between the inductors L1 and L4, where the inductor L1 is wound next to the inductor L4.

According to one embodiment, respective grounding metal stripes on one layer are connected to grounding metal stripes on another layer to form essentially one or more grounding walls or shields to further reduce or shield possible cross-coupling between the layers. Such shields may be achieved with a through-wafer via technology process which sometimes is referred to as via etching.

Figure 4D:
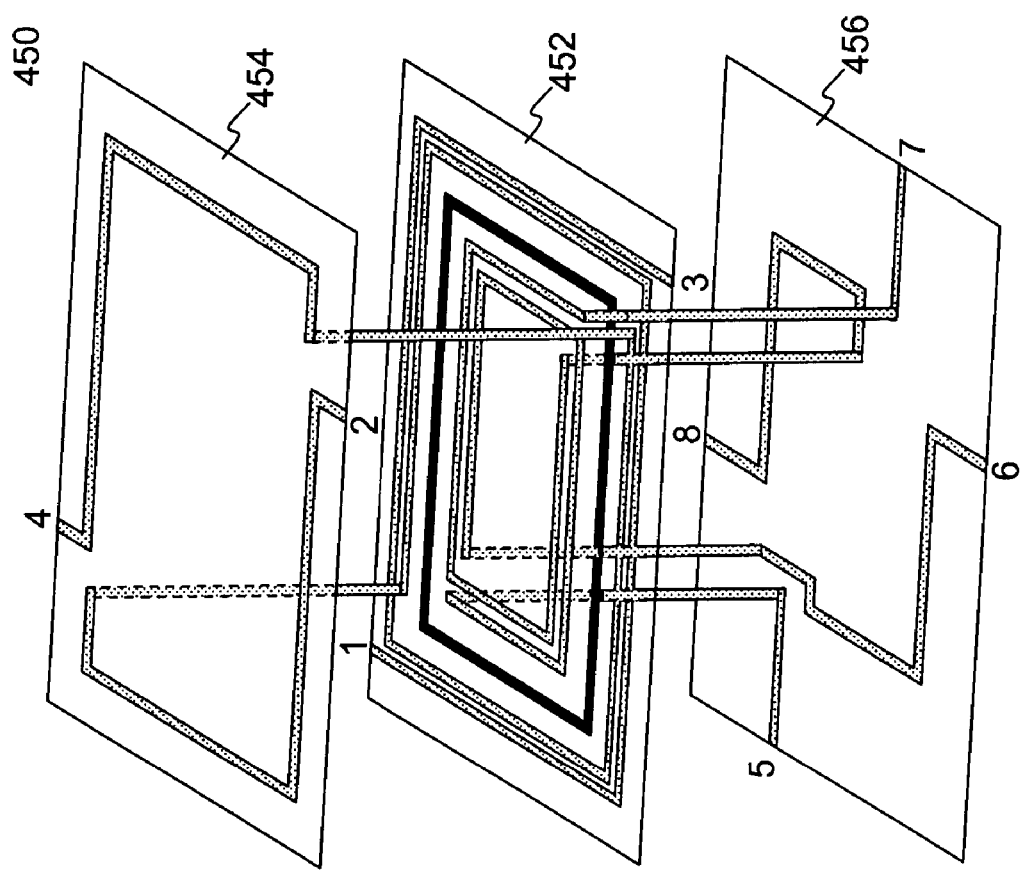
FIG. 4D shows another integrated transformers formed by multi-layer multi-interwound.

FIG. 4D shows another integrated transformers 450 formed by multi-layer multi-interwound. The layer 452 is used to form two transformers by interwound configuration, two additional layers 454 and 456 are used not only to provide terminals of the inductors but also to wind the respective stripes in certain manner so as to extend the inductance thereof and facilitate to couple the transformers to other components in a circuit. In certain integrated circuits for high frequency applications, additional layers on which individual inductors are respectively extended may be used to satisfy what is referred to as Electrically Equivalent Geometry.

Figure 5A:
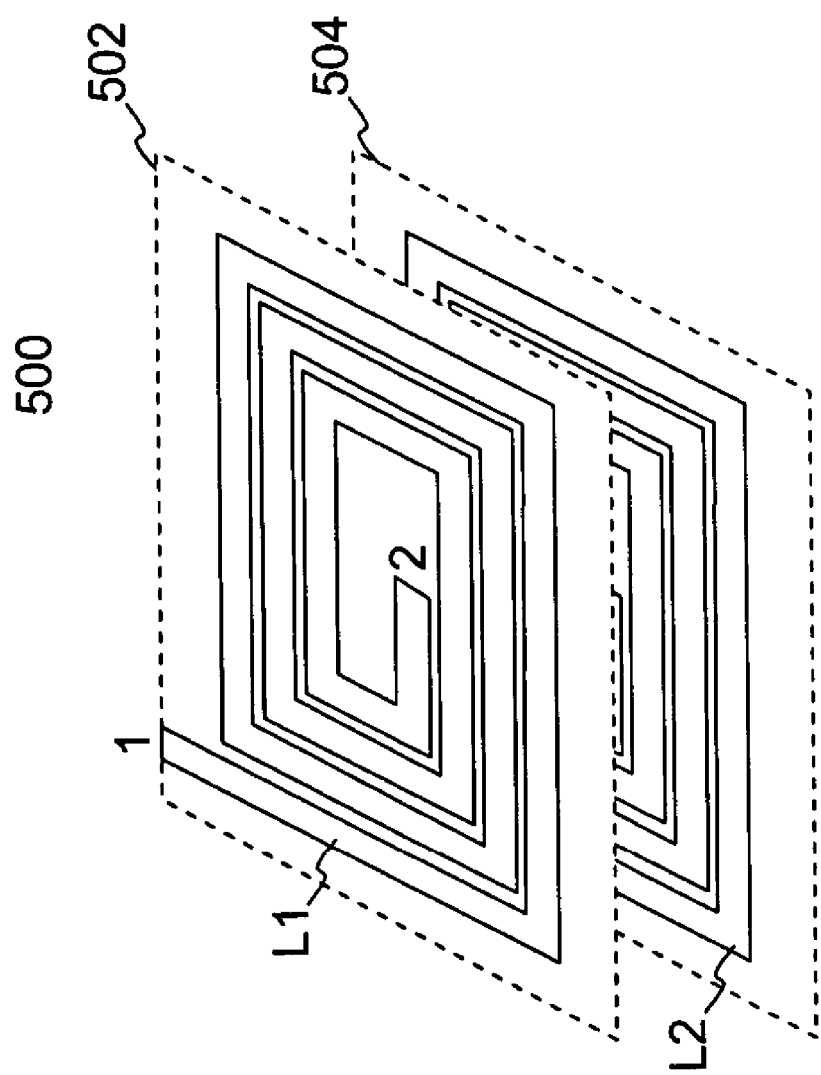
FIG. 5A shows an exemplary winding configuration of single-overlay type using two layers of the same winding to form a transformer

Referring now to FIG. 5A, there is an exemplary winding configuration 500, referred to as a single-overlay type. As the name suggests, two layers are employed to form a transformer instead of extending the stripes on the layers to increase the inductance. The winding configuration 500 includes two layers 502 and 504, each of the layers includes one individual inductor, the layer 502 has an inductor L1 and the layer 504 has an inductor L2. When the two layers 502 and 504 are arranged on top of each other, a transformer is created by coupling the inductors respectively on the layers 502 and 504. The equivalent schematic symbol or circuit of the transformer 500 is similar to that shown in FIG. 4B. When more inductance is sought, one or more layers can be added, in which case, these layers are for extending the stripes of each inductors and at the same time are arranged on top of each other to continue the coupling between the extended portions of the inductors. For example, a third layer having an inductor can be employed and electrically connected to the inductor on the layer 502 while a fourth layer having an inductor can be employed and connected to the inductor on the layer 504. When the third and fourth layers are, similar to the first and second layers 502 and 504, are arranged on top of each other, a transformer with increased inductances is thus formed. It can be appreciated that more layers may be employed accordingly to increase the inductance of either one or both of the inductors to meet a design requirement.

Figure 5B:
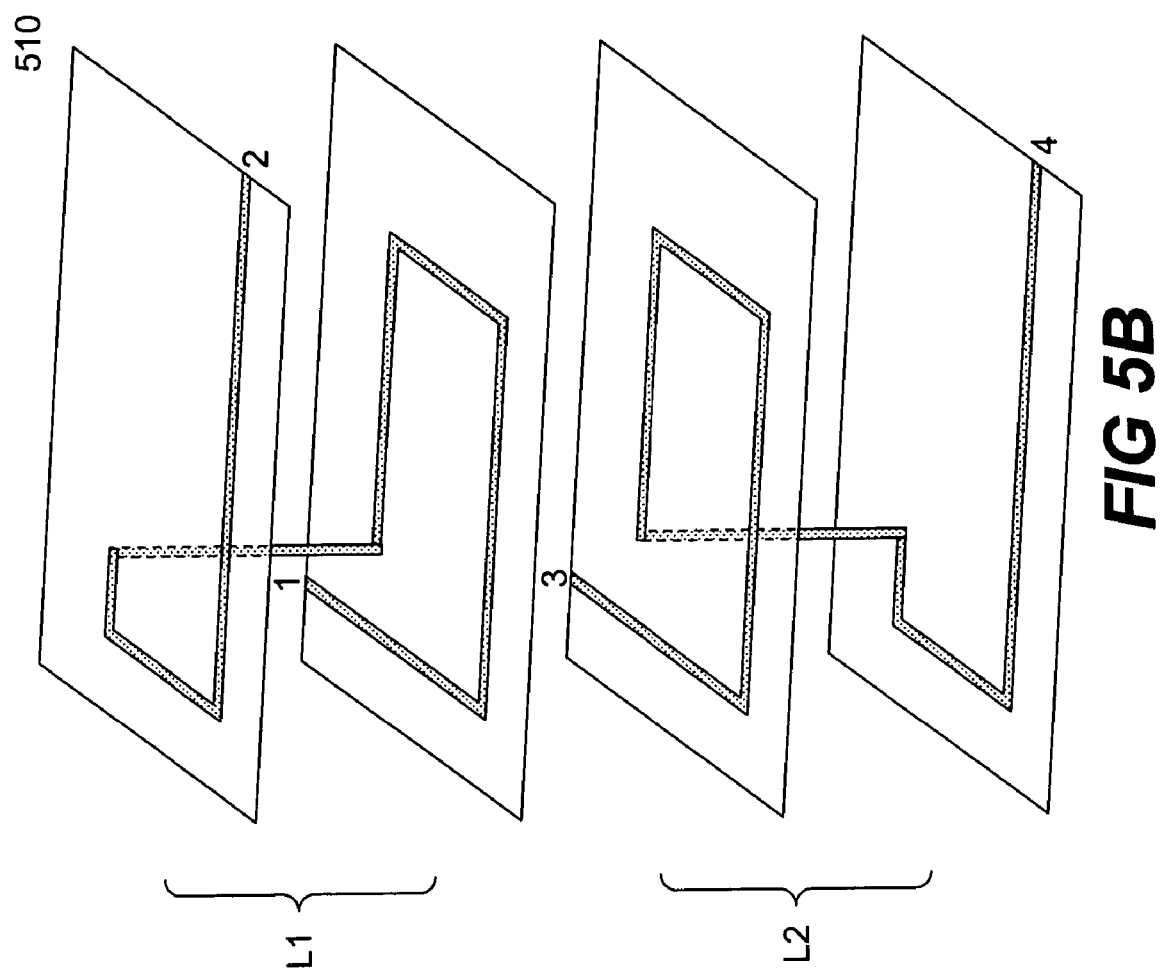
FIG. 5B shows a transformer, called multi-layer single-overlay (MLSO), formed by two inductors, each is extended to a second layer, and can be extended to more layers in the similar fashion, if necessary.

For simplicity, FIG. 5B shows a transformer 510 formed by two inductors L1 and L2, each is extended to a second layer, and can be extended to more layers in the similar fashion, if necessary. The transformer 510 is designed based on the winding configuration of the multi-layer single overlay type and is created by stacking or interlacing the layers.

To integrate two transformers together without increasing the occupying area, FIG. 5C shows a winding configuration 530, referred to as a multi-overlay, which may also be viewed that the winding configuration is based on the features, benefits, and advantages of one or more of FIG. 3A, FIG. 3C, FIG. 3D, FIG. 3E, FIG. 4A and FIG. 5A. The configuration 530 includes four individual inductors 532, 534, 536 and 538. In particular, a pair of inductors 532 and 534 is on a layer 540 and another pair of inductors 536 and 538 is on a layer 542. When these layers 540 and 542 are on top of each other, a first transformer including the inductors 532 and 536 and a second transformer including the inductors 534 and 538 are formed. The respective coupling factors are determined by the space, or a type of material if any, between the two layers 540 and 542. The layers 544 and 546 are provided to support the terminals of the inductors 532, 534, 536 and 538. The equivalent schematic symbol or circuit of the transformers of FIG. 5C is shown in FIG. 5D.

It is assumed that the inductors 532, 534, 536 and 538 are labeled as L1, L2, L3 and L4. Thus the first transformer M1 is formed by L1 and L3 and the second transformer M2 is formed by L2 and L4. However, unwanted transformers including those formed by L1 and L2, L3 and L4, L1 and L4, and L2 and L3 due to the coupling effects between these inductors can be created when the layers 540 and 542 are arranged on top of each other to form the transformers M1 and M2. In fact, it can be appreciated that the practical results involving cross-couplings can be more complicated than that just described when the layers 540 and 542 are so arranged.

Figure 5E:
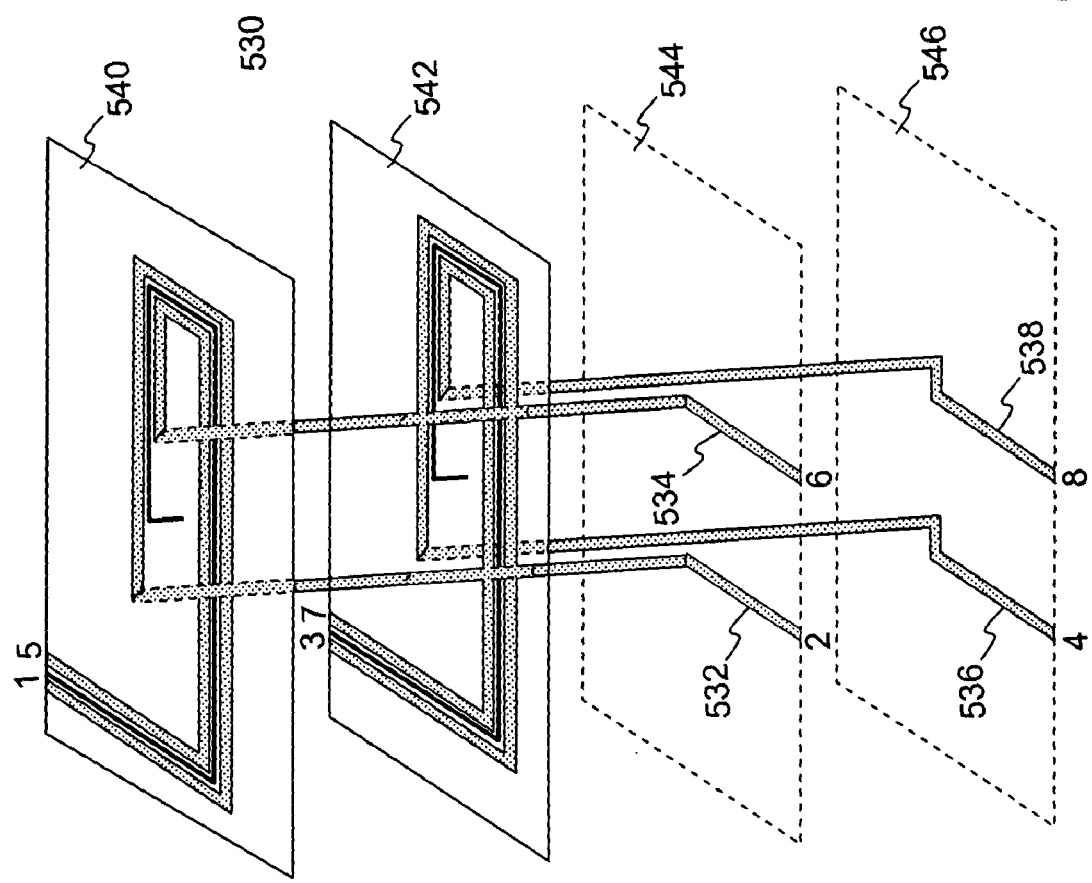
FIG. 5E shows an improved design over FIG. 5C by deposing one or more groundings (e.g. stripes) to isolate one inductor from another.

According to one embodiment of the present invention, FIG. 5E shows an improved design 530 over FIG. 5C by deposing one or more groundings (e.g. stripes or walls) to isolate one inductor from another. In particular, a grounding stripe is placed between the two inductors on the layers 540 and 542. Not shown in the figure, a ground wall can be formed by a vertical conducting curtain between the two stripes on the layers 540 and 542. Experiments have indicated that those unwanted transformers are thus eliminated or significantly reduced, making it now possible to integrate more transformers in a relatively small silicon space.

Figure 5F:
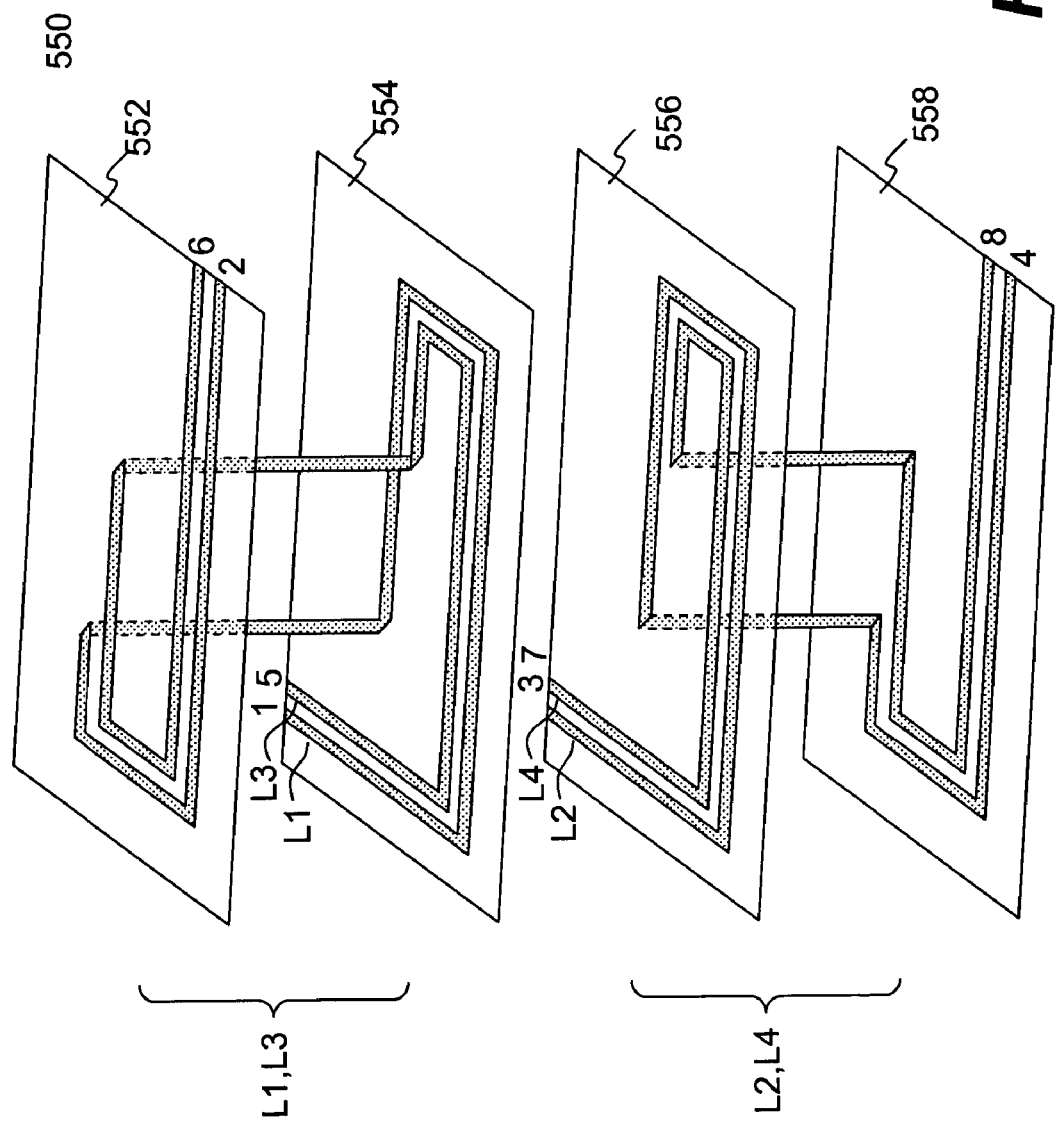
FIG. 5F shows two transformers by multi-layer multi-overlay configuration.

FIG. 5F shows two transformers 550 by multi-layer multi-overlay configuration. The equivalent schematic symbol or circuit of the transformers 550 is similar to that shown in FIG. 3B. Two inductors L1 and L3 are formed on layers 552 and 554, another two inductors L2 and L4 are formed on layers 556 and 558. When the four layers are stacked or interlaced on top of each other, a first transformer is formed by the inductors L1 and L2, and a second transformer is formed by the inductors L3 and L4. If necessary, a ground strip may be placed between the two inductors L1 and L3 on layers 552 and 554, as well as between the two inductors L2 and L4 on layers 556 and 558. For even better isolation, one or more grounding walls may be formed or placed across the layers.

Figure 5G:
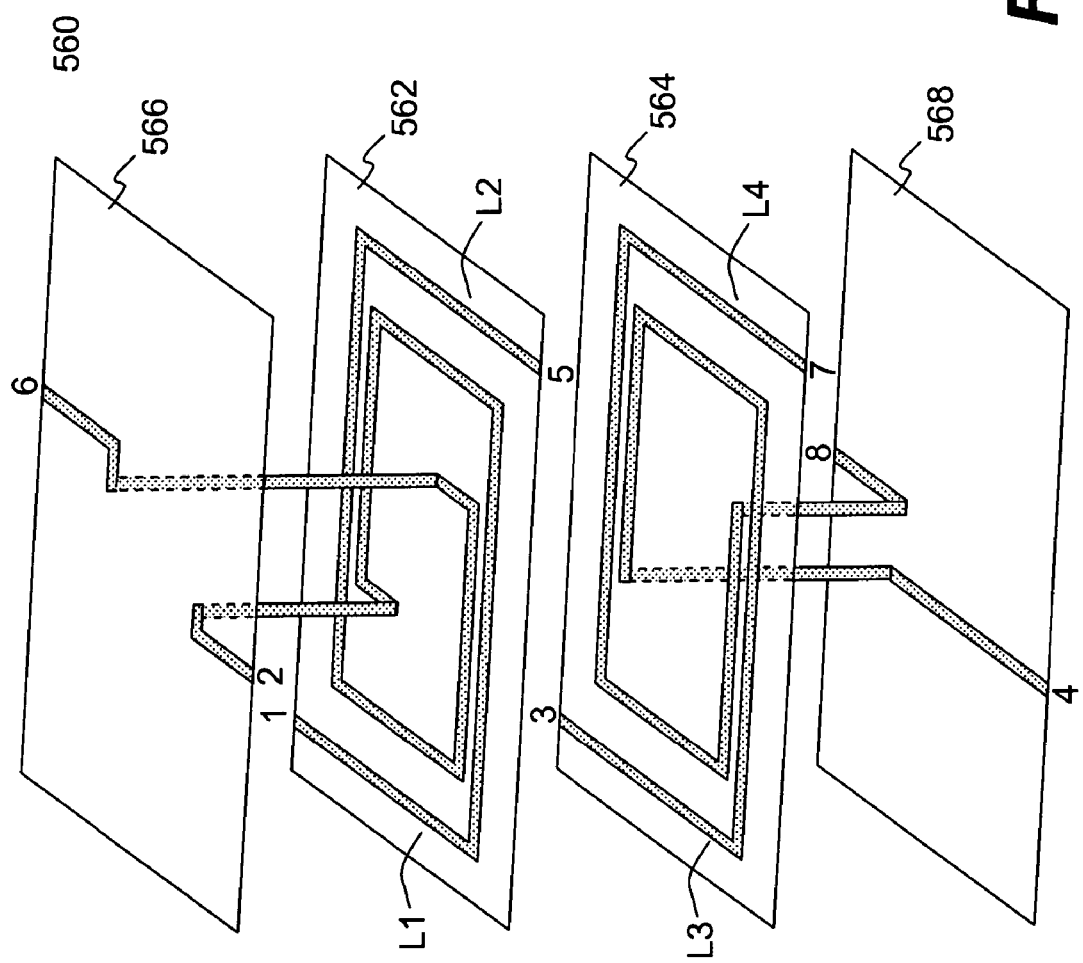
FIG. 5G shows another two transformers by overlay configuration in which the stripes on the layers are interwound.

FIG. 5G shows another two transformers 560 by multi-layer interwound-overlay configuration in which the stripes on the layers are interwound. As shown in FIG. 5G, a first transformer by two inductors L1 and L3 is formed by interwinding the respective stripes on layer 562 and a second transformer by two inductors L2 and L4 is formed by interwinding the respective stripes on layer 564. It is also possible to form two transformers by the conductors L1 and L2 as well as L3 and L4. The two layers 566 and 568 are provided for the terminals of these inductors and may also increase the inductance of the inductors. To facilitate the description of the winding configuration, the first set of the transformers is discussed herein. When the four layers are overlaid (e.g. stacked or interlaced) on top of each other, the first transformer is thus formed by the inductors L1 and L3, and the second transformer is formed by the inductors L2 and L4. The equivalent schematic symbol or circuit of the transformers 560 is similar to that shown in FIG. 3B. Preferably, a ground strip is placed between the two inductors respectively on layers 562 and 564 or a grounding wall between the layers 562 and 564.

Figure 6C:
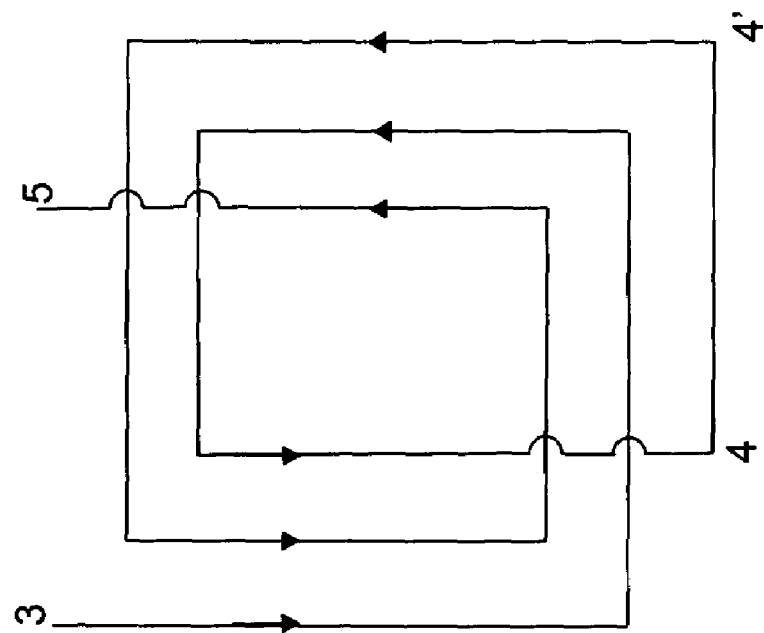
FIG. 6C shows an equivalent schematic symbol or circuit in accordance with the secondary of the transformer in FIG. 6B.
Figure 6A:
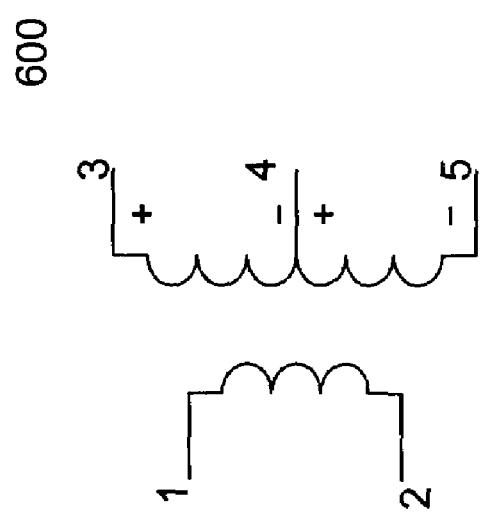
FIG. 6A shows an equivalent schematic symbol or circuit of an exemplary transformer with a single primary winding and several (two) secondary windings.

In some applications or designs, a transformer may be configured to have several secondary windings, each resulting in a different output (e.g., voltage). An equivalent schematic symbol or circuit of an exemplary transformer 600 is shown in FIG. 6A in which a primary winding (i.e., an inductor L12) is coupled with two secondary windings (i.e., inductors L34 and L45). For any given voltage across the primary, the voltage across each of the secondary windings is essentially determined by the number of turns in each secondary. A winding may be center-tapped as shown in the figure. To center tap a winding means to connect a wire to the center of the coil, so that between this center tap and either terminal of the winding there appears one-half of the voltage developed across the entire winding.

Figure 6B:
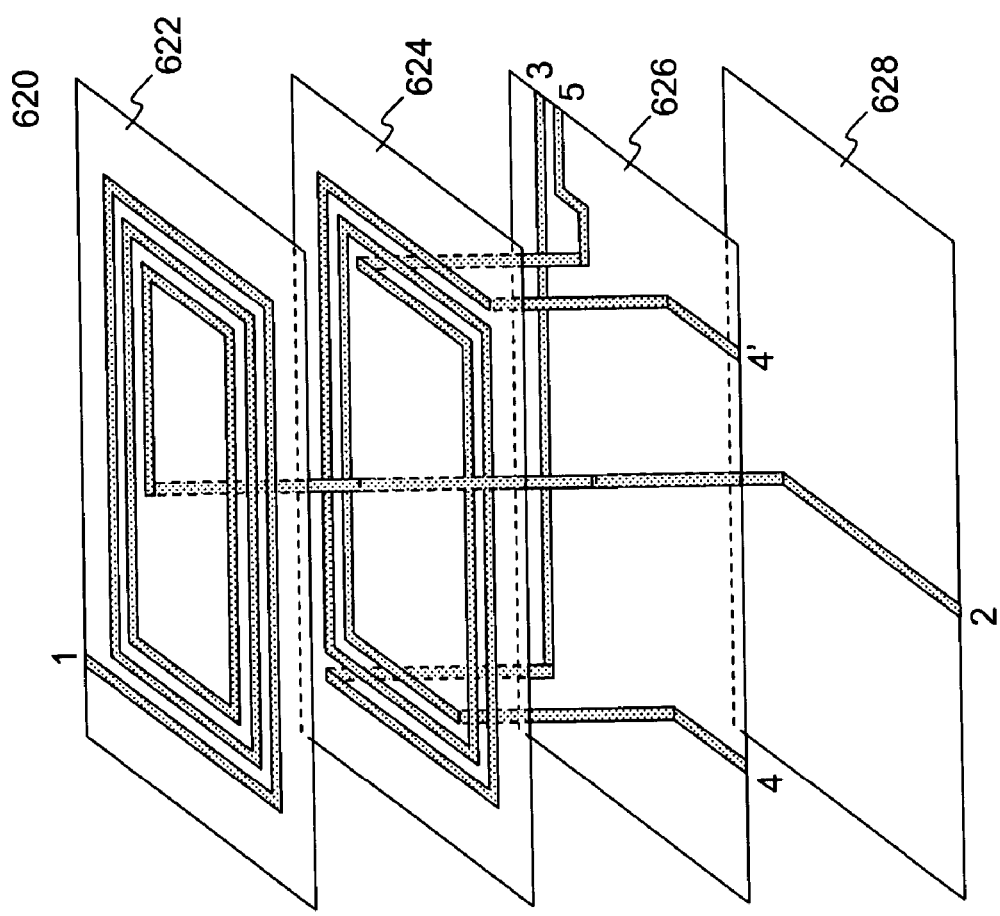
FIG. 6B shows a winding configuration of overlay-interwound with a center-tap transformer that corresponds to the transformer of FIG. 6A and includes two layers of stripe configurations.
Figure 8A:
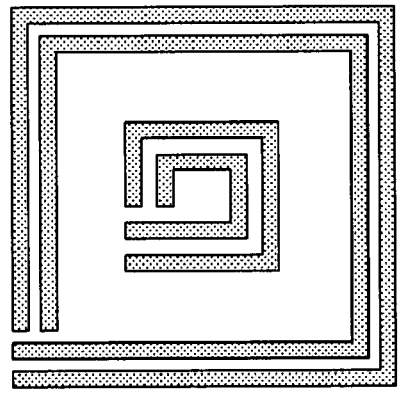
FIGS. 8A–8F shows, respectively, some possible configurations that may be derived from the present invention.
Figure 8B:
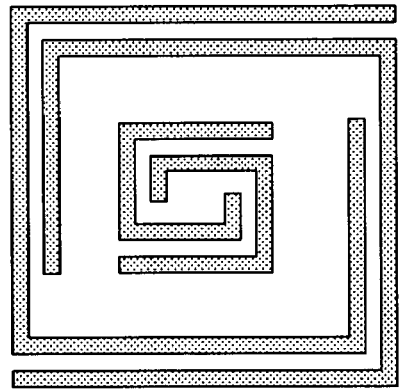
Figure 8C:
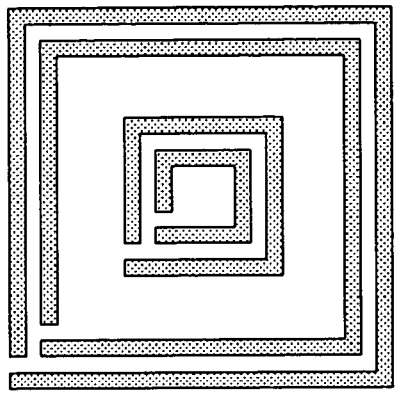
Figure 8D:
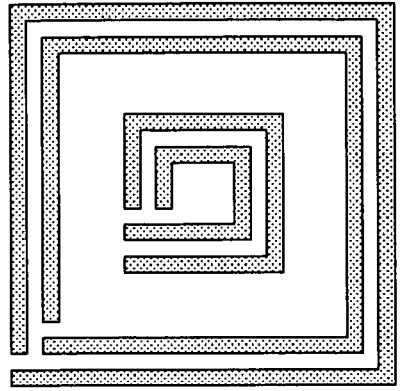
Figure 8F:
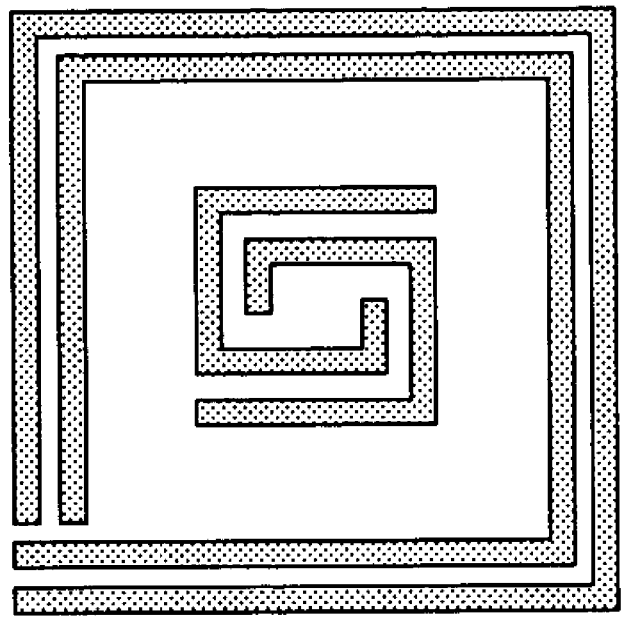
Figure 8E:
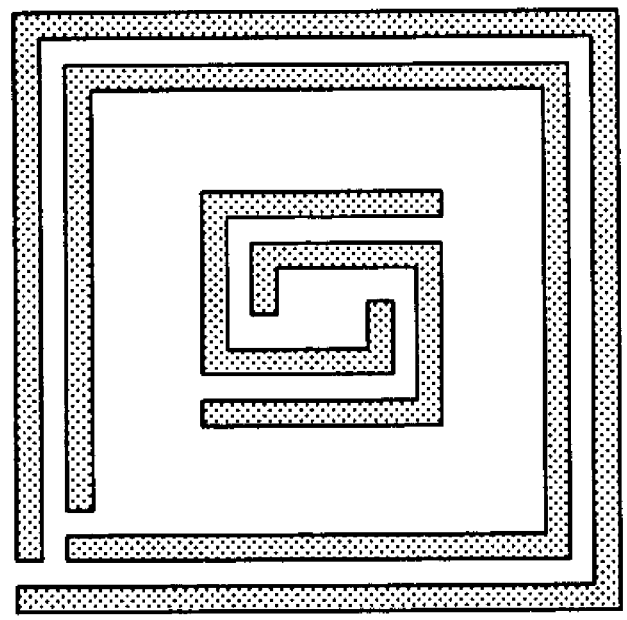

FIG. 6B shows a winding configuration 620 of a center-tap transformer that corresponds to the transformer 600 of FIG. 6A and includes two layers 622 and 624 (the layers 626 and 628 are for the terminals of the transformer). The winding configuration 620 is a type of overlay and forms the transformer 600 when the two layers 622 and 624 are arranged on top of each other. In particular, there is one inductor L12 as the primary on the layer 622 and there are two inductors L34 and L4'5 as the secondary on the layer 626. To function the transform as shown in FIG. 6A, the terminals 4 and 4' are connected together to a component (e.g., a transistor, a resistor, GND or VDD). A corresponding current flow illustration of the secondary winding is shown in FIG. 6C which also demonstrates the current symmetry in the transformer 600.

FIG. 7A shows what is called tri-transformer 700 including one primary winding with a center-tap and two separate secondary windings that overlay the primary winding, each of the secondary windings includes a center-tap. The equivalent schematic symbol or circuit of the transformers 700 is shown in FIG. 7B. In other words, both of the secondary windings are coupled with the primary winding. According to one embodiment, the tri-transformer 700 is created using three layers 702, 704 and 706. The primary winding is essentially formed on the center layer 704. The stripe 708 for the primary winding is wound around a flat spiral that has a shape in accordance with a predefined area in silicon for the transformer 700. To avoid electrical connect to the center tap, the stripe 708 extends to the layers 702 and 706 to skip over those portions that have been wound on the layer 704. The two secondary windings are formed jointly on the layer 702 and 706. In other words, to have a strong coupling with the primary winding, a first part of both secondary windings are formed on the layer 702 with minimized coupling between the first part 710 of the first secondary winding and the first part 712 of the second secondary winding. As shown in FIG. 7A, the first parts 710 and 712 of the first and second secondary windings are individually wound on the layer 702. If necessary, a grounding stripe may be placed between these two first parts 710 and 712.

Similarly, the second parts 714 and 716 of the first and second secondary windings are similarly formed on the layer 706 with minimum coupling therebetween. Again, If necessary, a grounding stripe may be placed between these two second parts 714 and 716. When these three layers 702, 704 and 706 are on top of each other, the tri-transformer 700 is created by the coupling between the primary and the first secondary as well as the second secondary.

According to one embodiment of the present inventions, one of the applications of the transformers used in integrated circuits is to adjust parasitic effects in favor to the performance of the integrated circuits when the signal frequency goes beyond certain ranges. It is well known in the art that the parasitic effects (e.g., parasitic capacitance) in components such as transistors can cause artifacts to output signals of a circuit or destabilize the circuit, thus limiting the frequency of the signal applied to the circuit. As shown FIG. 2, when a transformer is employed in a difference circuit, together with special designs of the transistors or resistors, resonant filtering can be inherently provided to minimize harmonic components in output signals from the circuit. As a result, the circuit is capable of processing signals of higher frequencies.

It has been known that the transformers can be used in many circuits. Efforts have been in the past to incorporate the transformers in integrated circuits, but resulting in expensive chips. With the present invention, it is now possible to employ transformers in many integrated circuits to improve their abilities to handle high-speed signals, such as transceivers, optical communication circuits and voltage control oscillators (VOC).

The present invention has been described in sufficient details with a certain degree of particularity. It is understood to those skilled in the art that the present disclosure of embodiments has been made by way of examples only and that numerous changes in the arrangement and combination of parts may be resorted without departing from the spirit and scope of the invention as claimed. For example, there are other possible configurations as shown in FIGS. 8A-8F, one or more grounding stripes may be used to isolate one transformer from another. When multiple layers are stacked on top of each other (e.g., more inductance), grounding walls may be used across the layers to minimize cross coupling between the layers. Accordingly, the scope of the present invention is defined by the appended claims rather than the foregoing description of embodiment.

We claim:

1. A transformer implemented in an integrated circuit, the transformer comprising:
   a first conducting stripe wound into a first flat spiral on a first layer; and
   a second conducting stripe wound into a second flat spiral on a second layer, the second conducting stripe including at least two segments, each having two terminals, wherein the first and second layers are stacked on top of each other and each of the two terminals of the two segments is coupled together to a connector in the integrated circuit, wherein a primary winding of the transformer is formed by the first conducting stripe, and a secondary winding of the transformer is formed by the second conducting stripe with the each of the two terminals of the two segments connected together as a center-tap of the secondary winding.

2. The transformer as recited in claim 1, wherein the connector is a terminal of a component in the integrated circuit.

3. The transformer as recited in claim 1, wherein the connector is a voltage or a ground of the integrated circuit.

4. The transformer as recited in claim 1, wherein the first conducting stripe includes a center-tap.

5. The transformer as recited in claim 4, wherein the first and second conducting stripes respectively extend to two or more other layers that are stacked with the first and second layers so that inductance of each of the first and second conducting stripes is increased.

6. The transformer as recited in claim 1, wherein at least one of the first conducting stripe and the second conducting stripe is extended to one or more additional layers to increase inductance thereof.

7. A transformer implemented in an integrated circuit, the transformer comprising:
   a first conducting stripe wound into a first flat spiral on a first layer;
   a second conducting stripe wound into a second flat spiral on at least a second layer;
   a third conducting stripe wound into a third flat spiral on at least a third layer; and
   wherein the first, second, and third layers are on top of each other, the first, second, and third conducting stripes are electrically not connected, and at least one of the first, second, and third conducting stripes includes a middle connector to be a center-tap.

8. The transformer as recited in claim 7, wherein the first conducting stripe is wound a number of loops around the first flat spiral and includes a middle connector extending across but not electrically connecting to the loops of the first conducting stripe to be a center-tap.

9. The transformer as recited in claim 7, wherein the first conducting stripe extends to the second as well as the third layer to avoid electrical connection to the middle connector on the first layer.

10. The transformer as recited in claim 8, wherein each of the second and third conducting stripes includes a center-tap.

11. The transformer as recited in claim 9, wherein the second conducting stripe extends to the third layer to increase inductance thereof.

12. The transformer as recited in claim 11, wherein the third conducting stripe extends to the second layer to increase inductance thereof.

13. The transformer as recited in claim 7, wherein at least one of the first conducting stripe, the second conducting stripe and the third conducting stripe is extended to one or more additional layers to increase inductance thereof.

14. A method for implementing a transformer in an integrated circuit, the method comprising:
  winding a first conducting stripe into a first flat spiral on a first layer; and
  winding a second conducting stripe into a second flat spiral on a second layer, the second conducting stripe including at least two segments, each having two terminals, wherein the first and second layers are stacked on top of each other and each of the two terminals of the two segments is coupled together to a connector in the integrated circuit, wherein a primary winding of the transformer is formed by the first conducting stripe, and a secondary winding of the transformer is formed by the second conducting stripe with the each of the two terminals of the two segments connected together as a center-tap of the secondary winding.

15. The method as recited in claim 14, wherein the connector is a terminal of a component in the integrated circuit.

16. The method as recited in claim 14, wherein the connector is a voltage or a ground of the integrated circuit.

17. The method as recited in claim 14, wherein the first conducting stripe includes a center-tap.

18. The method as recited in claim 17, wherein the first and second conducting stripes respectively extend to two or more other layers that are stacked with the first and second layers so that inductance of each of the first and second conducting stripes is increased.

19. A method for implementing a transformer in an integrated circuit, the method comprising:
  winding a first conducting stripe into a first flat spiral on a first layer;
  winding a second conducting stripe wound into a second flat spiral on a second layer;
  winding a third conducting stripe wound into a third flat spiral on a third layer; and
  wherein the first, second, and third layers are on top of each other, the first, second, and third conducting stripes are electrically not connected, and at least one of the first, second, and third conducting stripes includes a middle connector to be a center-tap.

20. The method as recited in claim 19, wherein the first conducting stripe is wound a number of loops around the first flat spiral and includes a middle connector extending across but not electrically connecting to the loops of the first conducting stripe.

21. The method as recited in claim 20, wherein the first conducting stripe extends to the second or third layer to avoid electrical connection to the middle connector on the first layer.

22. The method as recited in claim 20, wherein each of the second and third conducting stripes includes a center-tap.

23. The method as recited in claim 22, wherein the second conducting stripe extends to the third layer to increase inductance thereof.

24. The method as recited in claim 23, wherein the third conducting stripe extends to the second layer to increase inductance thereof.

25. The method as recited in claim 19, wherein at least one of the first conducting stripe, the second conducting stripe and the third conducting stripe is extended to one or more additional layers to increase inductance thereof.

\* \* \* \* \*